US011012005B2

(12) United States Patent
Polzer

(10) Patent No.: US 11,012,005 B2
(45) Date of Patent: May 18, 2021

(54) HOLLOW-CYLINDRICAL ULTRASONIC ACTUATOR AND METHOD OF ACTUATION

(71) Applicant: Physik Instrumente (PI) GmbH & Co. KG, Karlsruhe (DE)

(72) Inventor: Thomas Polzer, Graben-Neudorf (DE)

(73) Assignee: PHYSIK INSTRUMENT (PI) GMBH & CO. KG, Karlsruhe (DE)

( * ) Notice: Subject to any disclaimer, the term of this patent is extended or adjusted under 35 U.S.C. 154(b) by 354 days.

(21) Appl. No.: 16/314,816

(22) PCT Filed: Jun. 29, 2017

(86) PCT No.: PCT/DE2017/100548
§ 371 (c)(1),
(2) Date: Jan. 2, 2019

(87) PCT Pub. No.: WO2018/001418
PCT Pub. Date: Jan. 4, 2018

(65) Prior Publication Data
US 2019/0312530 A1    Oct. 10, 2019

(30) Foreign Application Priority Data

Jul. 1, 2016    (DE) ..................... 10 2016 112 101.0

(51) Int. Cl.
*H02N 2/02*    (2006.01)
*H02N 2/00*    (2006.01)
(Continued)

(52) U.S. Cl.
CPC ............. *H02N 2/026* (2013.01); *H02N 2/002* (2013.01); *H02N 2/006* (2013.01);
(Continued)

(58) Field of Classification Search
CPC ................................................... H01L 41/0986
See application file for complete search history.

(56) References Cited

U.S. PATENT DOCUMENTS 5,117,148 A     5/1992  Nakamura et al.
2009/0039736 A1*  2/2009  Matsuo ............... H01L 41/0833
                                                     310/323.16
(Continued)

FOREIGN PATENT DOCUMENTS

JP    H1174578 A    3/1999
JP    2015088623 A    5/2015

OTHER PUBLICATIONS

International Search Report (PCT/ISA/210) dated Dec. 20, 2017, by the European Patent Office as the International Searching Authority for International Application No. PCT/DE2017/100548.
(Continued)

*Primary Examiner* — Emily P Pham
(74) *Attorney, Agent, or Firm* — Buchanan Ingersoll & Rooney PC

(57) ABSTRACT

A hollow-cylindrical ultrasonic actuator is disclosed a central axis, an inner peripheral surface facing the central axis and an outer peripheral surface facing away from the central axis and spaced apart from the inner peripheral surface, a closed inner contour curve, a closed outer contour curve, at least one electrode, and an electromechanical material provided between opposed electrodes. In a non-actuated state of the ultrasonic actuator, a curvature of the inner contour curve or of an outer contour curve includes at least three mutually spaced-apart local maximum points.

16 Claims, 2 Drawing Sheets

Figure 1:
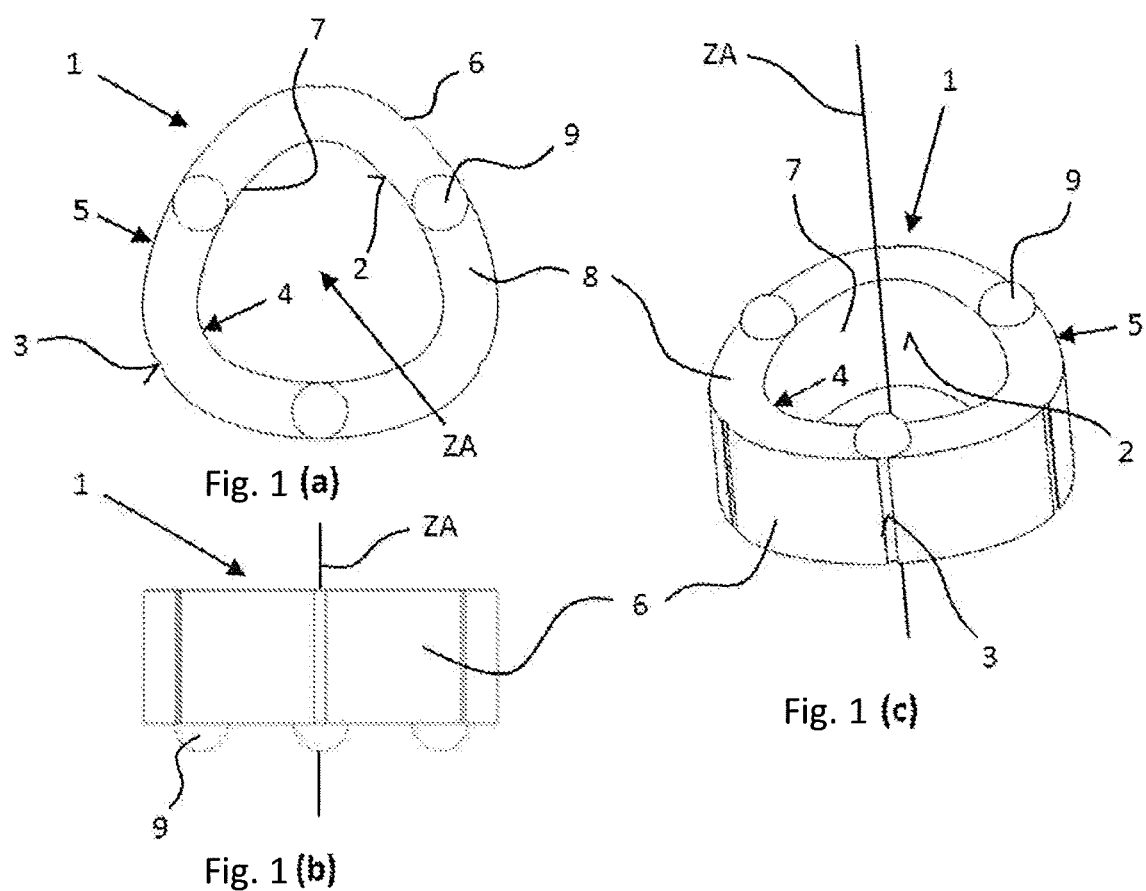

(51) Int. Cl.
*H02N 2/04* (2006.01)
*H02N 2/06* (2006.01)
*H01L 41/09* (2006.01)
*H02N 2/10* (2006.01)

(52) U.S. Cl.
CPC ......... *H02N 2/0055* (2013.01); *H02N 2/0065* (2013.01); *H02N 2/04* (2013.01); *H02N 2/06* (2013.01); *H01L 41/0986* (2013.01); *H02N 2/103* (2013.01)

(56) References Cited

U.S. PATENT DOCUMENTS

| | | | |
|---|---|---|---|
| 2009/0303622 A1 | 12/2009 | Ashizawa | |
| 2014/0354116 A1 | 12/2014 | Xia et al. | |
| 2015/0229240 A1* | 8/2015 | Wischnewskiy | H01L 41/0835 310/317 |

OTHER PUBLICATIONS

Written Opinion (PCT/ISA/237) dated Dec. 20, 2017, by the European Patent Office as the International Searching Authority for International Application No. PCT/DE2017/100548.

* cited by examiner

HOLLOW-CYLINDRICAL ULTRASONIC ACTUATOR AND METHOD OF ACTUATION

The present invention relates to an ultrasonic actuator according to claim 1 and to an arrangement of such an ultrasonic actuator on a support device according to claim 6.

The unpublished German application 10 2015 120 282.4 discloses a hollow-cylindrical ultrasonic actuator made of an electromechanical material and comprising electrodes, which are arranged on the inner peripheral surface and on the outer peripheral surface thereof. When the electrodes have electric voltages applied thereto in a suitable manner, deformation vibrations can be excited in the ultrasonic actuator and in the electromechanical material, respectively, these deformation vibrations being utilizable for driving an element to be driven.

The hollow-cylindrical ultrasonic actuator itself is supported such that it is largely stationary and secured against rotation, so that it will carry out no movements or, at most, negligible movements relative to the respective support and, as a result, the drive of the element to be driven will be as effective as possible.

The support in question is realized by the mandrel of a housing whose outer peripheral geometry is complementary to the inner peripheral geometry of the hollow-cylindrical ultrasonic actuator, the ultrasonic actuator resting with one of its flat end faces on a silicone rubber disk, which is pressed against the ultrasonic actuator by means of a biasing spring, and the biasing spring itself resting on a further silicone rubber disk, which abuts on the housing.

The above is disadvantageous insofar as the support in question is comparatively complex and is therefore difficult to mount as well as comparatively cost-intensive. Another disadvantage is to be seen in that, in spite of the complex structural design of the support, the prevention of a rotary relative movement of the ultrasonic actuator relative to this support can only be accomplished in an unsatisfactory manner, when comparatively high torques act on the ultrasonic actuator. When a rotary relative movement of the ultrasonic actuator relative to the mandrel of the support takes place, there will be the risk that the electrode arranged on the inner peripheral surface, or the electric connection of this electrode, may be destroyed or detached, whereby further operation of the ultrasonic actuator would no longer be possible without an appropriate disassembly and repair.

Hence, it is the object of the present invention to provide a hollow-cylindrical ultrasonic actuator, which, even if high torques act on the ultrasonic actuator, will fully or largely avoid a rotary relative movement of the ultrasonic actuator relative to its support in a reliable, simple and installation-friendly manner.

This object is achieved by an ultrasonic actuator according to claim 1. The subclaims following claim 1 represent at least expedient further developments.

It is a further object of the present invention to provide an arrangement of such an ultrasonic actuator on a support device. This object is achieved by an arrangement according to claim 6, the subclaims following claim 6 representing at least expedient further developments.

Hence, an ultrasonic actuator having a hollow-cylindrical geometry with a central axis ZA is taken as a basis, the ultrasonic actuator comprising an inner peripheral surface facing the central axis and an outer peripheral surface facing away from the central axis. The area defined or enclosed or circumscribed by the inner peripheral surface has a center of area through which a centroidal axis, which is coincident with the central axis, extends in a direction perpendicular to the circumscribed area.

The area delimited or circumscribed by the inner peripheral surface will also be referred to as internal cross-sectional area of the hollow cylinder hereinafter. Analogously, the area circumscribed or delimited by the outer peripheral surface will also be referred to as external cross-sectional area hereinafter.

The curve of intersection formed by a cross-section, perpendicular to the central axis, with the inner peripheral surface defines an inner contour curve, while the curve of intersection formed analogously with the outer peripheral surface defines an outer contour curve. In other words, the inner contour curve is the curve along the internal cross-sectional area, while the outer contour curve is the curve along the external cross-sectional area. Both the inner contour curve and the outer contour curve are a respective closed curve.

The inner peripheral surface has arranged thereon at least one electrode. Likewise, the outer peripheral surface has arranged thereon at least one electrode, which overlaps, at least sectionwise, the electrode arranged on the inner peripheral surface. In the area in which the electrode arranged on the inner peripheral surface overlaps the electrode arranged on the outer peripheral surface, an electromechanical material, e.g. a piezoelectric material or a piezoceramic material, is arranged between the respective opposed electrodes. By applying a suitable electric voltage to the electrodes, deformation vibrations can be excited in the ultrasonic actuator and in the electromechanical material, respectively, these deformation vibrations being utilizable for driving, in particular for rotationally driving, an element to be driven, which is in frictional contact with the ultrasonic actuator.

According to the present invention, the inner contour curve and/or the outer contour curve comprise/comprises at least three spaced-apart local points of maximum curvature and three spaced-apart local points of a minimum radius of curvature in the non-activated and thus undeformed state of the ultrasonic actuator. This means that the curvature or the radius of curvature of the inner contour curve and/or of the outer contour curve changes more than once along the respective profile. In other words, the curve or the contour or outline of the internal cross-sectional area and/or of the external cross-sectional area has a radius of curvature that changes as the peripheral angle changes so that the internal cross-sectional area and/or the external cross-sectional area have a non-round contour and a non-round outline, respectively. It follows that the inner contour curve and/or the outer contour curve have a shape which deviates from the circular shape and which, in particular, periodically deviates from the circular shape.

Due to the contour of the inner peripheral surface and of the outer peripheral surface, the ultrasonic actuator according to the present invention can easily be held or supported on the inner peripheral surface and/or the outer peripheral surface such that the ultrasonic actuator will substantially not undergo any displacement or rotation when in operation.

It may be of advantage that the points of maximum curvature are spaced apart equidistantly along the inner and/or outer contour curve.

Furthermore, it may be of advantage that the number of points of maximum curvature corresponds to an odd natural number. In addition to the above-described minimum number of three local points of maximum curvature, in particular five local points of maximum curvature may be of advantage.

It may also be of advantage when the change of the radius of curvature along the inner and/or outer contour curve is of a continuous nature. According to a particularly advantageous embodiment, the contour curve has the shape of a polygon. The term "continuous" should here be understood as continuous in the geometrical sense, i.e. the contour curve in question does not exhibit any corners or edges and it has an unequivocal tangent on any point thereof. Mechanical stress peaks in the ultrasonic actuator can be avoided in this way.

Furthermore, it may be of advantage that the shape of the inner contour curve is geometrically similar to the shape of the outer contour curve. The thickness of the ultrasonic actuator is therefore identical at all points of the periphery in a radial direction, so that a homogeneous electric field can easily be realized within the electromechanical material.

The present invention further comprises an arrangement of the above described ultrasonic actuator on a support device, the support device contacting the inner peripheral surface of the ultrasonic actuator at the sections where the inner contour curve exhibits a local curvature maximum or a local minimum with respect to the radius of curvature. Hence, there may be a plurality of areas or sections of the inner peripheral surface at which the contour curve of the internal cross-sectional area exhibits a (local) minimum radius of curvature, the radius of curvature of the subsequent areas of the contour curve being larger.

It may here be of advantage that the support device contacts the inner peripheral surface of the ultrasonic actuator via spherical sections or via spherical elements. In this respect, it may prove to be advantageous when the spherical elements or the spherical sections are elastically deformable. The spherical elements or the spherical sections provide a reliable unequivocal contact with the inner peripheral surface of the ultrasonic actuator. When elastically deformable spherical elements or spherical sections are provided, it will not be necessary to observe close dimensional tolerances.

Furthermore, it may of advantage that the support device comprises elastically deformable sections, preferably configured as flexure hinges. Also this makes it unnecessary to observe close dimensional tolerances.

In addition, it may be of advantage that the support device has a star-shaped geometry having arm sections which extend from a common center.

In a particularly advantageous manner, the distal end of each arm section has arranged thereon a spherical element, and each arm section comprises a deformable section formed integrally therewith and configured as a flexure hinge.

The present invention additionally relates to the use of the above described ultrasonic actuator in a drive, preferably in a rotary or rotating drive. However, it is also imaginable to use the above described ultrasonic actuator in a linear drive, since the respective deformations of the ultrasonic actuator can be realized by adequate activation.

Figure 2:
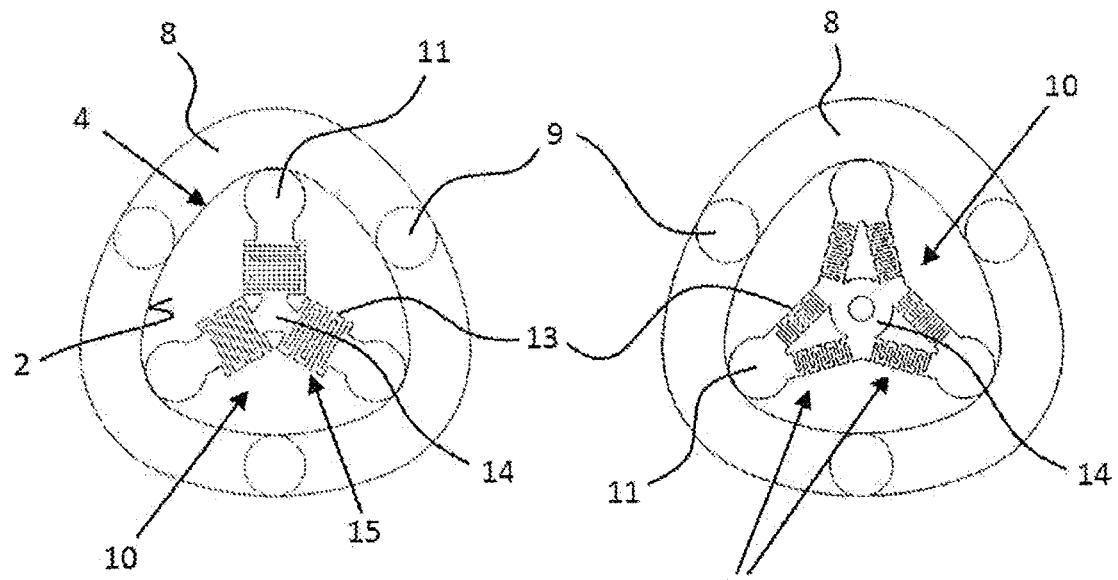
Figure 3:
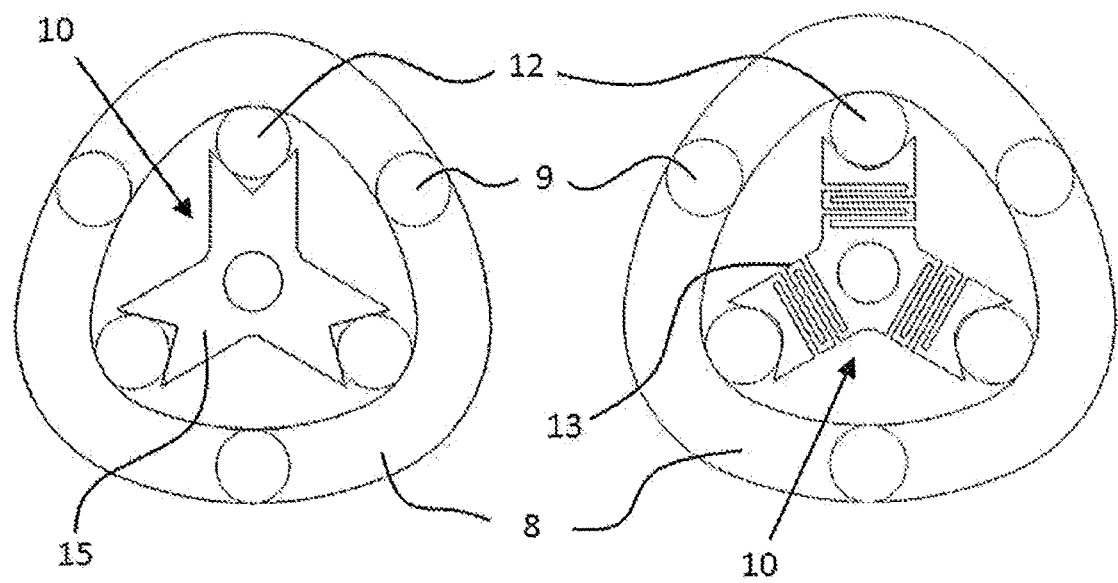

In the following, an embodiment of the ultrasonic actuator according to the present invention and embodiments concerning the arrangement of such an ultrasonic actuator on a support device will be described with respect to the respective figures. Like reference numerals refer here to like components of the different figures,
in which
FIG. 1 shows representations (a) to (c): an ultrasonic actuator according to the present invention in different views
FIG. 2 shows representations (a) and (b): an arrangement of the ultrasonic actuator according to the present invention, as shown in FIG. 1, on different support devices FIG. 3 shows representations (a) and (b): an arrangement of the ultrasonic actuator according to the present invention, as shown in FIG. 1, on further possible support devices FIG. 1 (*a*) shows, in a top view, a possible embodiment of an ultrasonic actuator 1 according to the present invention. The latter has a hollow-cylindrical geometry comprising a central axis ZA, an inner peripheral surface 2 facing the central axis and an outer peripheral surface 3 facing away from the central axis. The area defined or enclosed or circumscribed by the inner peripheral surface 2 has here a center of area through which a centroidal axis, which is coincident with the central axis ZA, extends in a direction perpendicular to the circumscribed area.

The curve of intersection formed by a cross-section, perpendicular to the central axis, with the inner peripheral surface 2 defines an inner closed contour curve 4, while the curve of intersection formed analogously with the outer peripheral surface 3 defines an outer closed contour curve 5.

The inner peripheral surface 2 has arranged thereon a single electrode 7 covering the entire inner peripheral surface 2, while the outer peripheral surface 3 has arranged thereon a plurality of electrodes 6 that are distributed over the periphery and spaced apart from one another. Between the respective opposed electrodes, i.e. in the overlapping area of the respective electrodes 6 and 7, an electromechanical material is arranged.

A flat end face 8 of the ultrasonic actuator has arranged thereon a plurality of peripherally distributed friction elements 9 in the form of half-spheres or partial spheres. These spheres are provided for frictional contact with an element to be driven, which is not shown in FIG. 1. By applying a suitable electric voltage to the electrodes 6 and 7, deformation vibrations can be excited in the electromechanical material of the ultrasonic actuator. These deformation vibrations propagate to the friction elements 9, and the respective movements of the friction elements 9 can then be transmitted to the element to be driven, so that the latter will, in the final analysis, carry out a desired drive movement. The ultrasonic actuator 1 according to FIG. 1 is here preferably used for the rotary drive of an element to be driven, but linear drives can also be realized in this way.

FIG. 1 (*b*) shows the ultrasonic actuator according to FIG. 1 (*a*) in a perspective view, while FIG. 1 (*c*) shows the ultrasonic actuator according to FIG. 1 (*a*) in a side view. On the basis of FIGS. 1 (*b*) and 1 (*c*), in particular the electrodes 6 arranged on the outer peripheral surface 3 can be seen more clearly.

FIG. 2 shows in representations (a) and (b) an arrangement of the ultrasonic actuator according to FIG. 1 on different support devices, as disclosed by the present invention. According to FIG. 2 (*a*), the support device 10 has a star-shaped geometry with three arm sections 15 extending outwards from a common center 14, each arm section 15 being formed integrally with a spherical section 11 and an elastically deformable section 13. Each of the deformable sections 13 is here configured as a flexure hinge.

The spherical sections 11 contact the inner peripheral surface 2 of the ultrasonic actuator 1 at the sections where the inner contour curve 4 exhibits a local minimum with respect to the radius of curvature and a local maximum with respect to the curvature.

Other than the embodiment according to FIG. 2 (*a*), the support device 10 according to FIG. 2 (*b*) comprises arm sections 15, which each have two webs, each web comprising a deformable section 13 configured as a flexure hinge and the two webs being connected to each other at their respective distal end via a spherical section 11. The center 14 of the support device 10 is configured as a circular section to which the respective other ends of the webs of the arm sections 15 are integrally connected.

FIG. 3 shows in representations (a) and (b) two additional embodiments of support devices for arranging the ultrasonic actuator according to FIG. 1. According to FIG. 3 (a), the support device 10 is star-shaped and comprises three arm sections 15 having at their respective distal end a receiving section for receiving and supporting, respectively, a spherical element 12, which is elastically deformable. The support device 10 according to FIG. 3 (b) differs from the support device shown in FIG. 3 (a) only insofar as elastically deformable sections 13 in the form of flexure hinges are formed integrally with the arm sections 15.

The invention claimed is:

1. A hollow-cylindrical ultrasonic actuator comprising:
a central axis (ZA);
an inner peripheral surface facing the central axis (ZA) and an outer peripheral surface facing away from the central axis (ZA) and spaced apart from the inner peripheral surface, wherein in a cross-section perpendicular to the central axis (ZA) the inner peripheral surface defines a closed inner contour curve and the outer peripheral surface defines a closed outer contour curve;
at least one electrode arranged on each of the inner peripheral surface as well as the outer peripheral surface; and
an electromechanical material provided between opposed electrodes, vibration deformations to be excited in the hollow-cylindrical ultrasonic actuator by electrically actuating the at least one electrode, these vibration deformations being utilizable for driving an element when in frictional contact with the hollow-cylindrical ultrasonic actuator, wherein in a non-actuated state of the hollow-cylindrical ultrasonic actuator, at least one of the closed inner contour curve or the closed outer contour curve includes at least three spaced-apart local points of maximum curvature.

2. The hollow-cylindrical ultrasonic actuator according to claim 1, wherein the at least three spaced-apart local points of maximum curvature are spaced apart equidistantly along the closed inner contour curve and/or the closed outer contour curve.

3. The hollow-cylindrical ultrasonic actuator according to claim 1, wherein the at least three spaced-apart local points of maximum curvature corresponds to an odd natural number.

4. The hollow-cylindrical ultrasonic actuator according to claim 1, wherein a curvature of the closed inner contour curve or a curvature of the closed outer contour curve changes continuously along its respective profile.

5. The hollow-cylindrical ultrasonic actuator according to claim 1, wherein a shape of the closed inner contour curve is geometrically similar to a shape of the closed outer contour curve and wherein a thickness of the hollow-cylindrical ultrasonic actuator is equal along a periphery.

6. The hollow-cylindrical ultrasonic actuator of claim 1 in combination with:
a support device to form an arrangement, wherein the support device contacts the inner peripheral surface of the ultrasonic actuator at a section where a curvature of the closed inner contour curve exhibits a local maximum.

7. The hollow-cylindrical ultrasonic actuator of claim 6, wherein contacts of the support device with the inner peripheral surface of the hollow-cylindrical ultrasonic actuator comprise:
spherical sections or spherical elements.

8. The hollow-cylindrical ultrasonic actuator of claim 7, wherein the spherical sections or the spherical elements are elastically deformable.

9. The hollow-cylindrical ultrasonic actuator of claim 6, wherein the support device comprises:
elastically deformable sections configured as flexure hinges.

10. The hollow-cylindrical ultrasonic actuator of claim 6, wherein the support device has a star-shaped geometry which comprises:
arm sections which extend from a common center.

11. The hollow-cylindrical ultrasonic actuator of claim 10 wherein a distal end of each arm section comprises:
a spherical element, and wherein each arm section includes a deformable section formed integrally therewith and configured as a flexure hinge.

12. A method for driving an element, the method comprising:
providing a hollow-cylindrical ultrasonic actuator having electrodes, an electromechanical material provided between opposed electrodes, a central axis (ZA), and an inner peripheral surface facing the central axis (ZA) and an outer peripheral surface facing away from the central axis (ZA) and spaced apart from the inner peripheral surface, wherein in a cross-section perpendicular to the central axis (ZA) the inner peripheral surface defines a closed inner contour curve and the outer peripheral surface defines a closed outer contour curve, the method comprising:
arranging at least one electrode on each of the inner peripheral surface as well as the outer peripheral surface; and
electrically activating the at least one electrode to excite the vibration deformations, these vibration deformations driving an element in frictional contact with the hollow-cylindrical ultrasonic actuator, wherein in a non-actuated state of the hollow-cylindrical ultrasonic actuator, at least one of the closed inner contour curve or the closed outer contour curve include at least three spaced-apart local points of maximum curvature.

13. The hollow-cylindrical ultrasonic actuator according to claim 2, wherein the at least three spaced-apart local points of maximum curvature corresponds to an odd natural number.

14. The hollow-cylindrical ultrasonic actuator according to claim 13, wherein a curvature of the closed inner contour curve or a curvature of the closed outer contour curve changes continuously along its respective profile.

15. The hollow-cylindrical ultrasonic actuator according to claim 14, wherein a shape of the closed inner contour curve is geometrically similar to a shape of the closed outer contour curve and wherein a thickness of the hollow-cylindrical ultrasonic actuator is therefore equal along a periphery.

16. The hollow-cylindrical ultrasonic actuator of claim 15 in combination with:
a support device to form an arrangement, wherein the support device contacts the inner peripheral surface of the hollow-cylindrical ultrasonic actuator at a section where a curvature of the closed inner contour curve exhibits a local maximum.

* * * * *